(12) United States Patent
Lee et al.

(10) Patent No.: US 7,144,815 B2
(45) Date of Patent: Dec. 5, 2006

(54) CHEMICAL MECHANICAL POLISHING SLURRY

(75) Inventors: Jae-dong Lee, Seoul (KR); Bo-un Yoon, Seoul (KR); Sang-rok Hah, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 134 days.

(21) Appl. No.: 10/757,410

(22) Filed: Jan. 15, 2004

(65) Prior Publication Data

US 2004/0154231 A1 Aug. 12, 2004

Related U.S. Application Data

(62) Division of application No. 10/023,948, filed on Dec. 21, 2001, now Pat. No. 6,855,267.

(30) Foreign Application Priority Data

Dec. 22, 2000 (KR) ............................... 2000-80715

(51) Int. Cl.
*H01L 21/302* (2006.01)
*C09K 13/00* (2006.01)
*C09K 13/06* (2006.01)

(52) U.S. Cl. ..................... 438/692; 252/79.1; 252/79.4

(58) Field of Classification Search ............... 252/79.1, 252/79.4; 438/692
See application file for complete search history.

(56) References Cited

U.S. PATENT DOCUMENTS

| 5,139,571 | A | * | 8/1992 | Deal et al. | ..................... | 106/3 |
| 5,607,718 | A | | 3/1997 | Sasaki et al. | | |
| 5,869,392 | A | | 2/1999 | Kimura | | |
| 6,132,637 | A | | 10/2000 | Hosali et al. | | |
| 6,354,913 | B1 | | 3/2002 | Miyashita et al. | | |
| 6,855,267 | B1 | * | 2/2005 | Lee et al. | ................. | 252/79.1 |

FOREIGN PATENT DOCUMENTS

KR P1998-063482 10/1998

\* cited by examiner

*Primary Examiner*—Nadine G. Norton
*Assistant Examiner*—Lynette T. Umez-Eronini
(74) *Attorney, Agent, or Firm*—Volentine Francos & Whitt, PLLC

(57) ABSTRACT

A polishing slurry including an abrasive, deionized water, a pH controlling agent, and polyethylene imine, can control the removal rates of a silicon oxide layer and a silicon nitride layer which are simultaneously exposed during chemical mechanical polishing (CMP) of a conductive layer. A relative ratio of the removal rate of the silicon oxide layer to that of the silicon nitride layer can be controlled by controlling an amount of the choline derivative.

5 Claims, 3 Drawing Sheets

CHEMICAL MECHANICAL POLISHING SLURRY

This is a divisional application of Ser. No. 10/023,948 filed Dec. 21, 2001, now U.S. Pat. No. 6,855,267.

BACKGROUND OF THE INVENTION

1. Field of the Invention

The present invention relates to a polishing slurry used for a chemical mechanical polishing (CMP) process, and more particularly, to a polishing slurry which allows for control of removal rates of a silicon oxide layer and a silicon nitride layer exposed during polishing of a polysilicon layer.

2. Description of the Related Art

Semiconductor devices are comprised of numerous integrated circuits, which are produced by selectively and repeatedly performing a series of photographic, etching, diffusive, metal deposition, and other process steps. For example, plasma enhanced-chemical vapor deposition (PE-CVD) processes and reactive ion etch (RIE) processes are used to fully form device patterns that are pre-set on the wafer.

During the semiconductor device manufacturing process, a chemical mechanical polishing (CMP) process is typically used for horizontally planarizing various kinds of layers, such as oxide layers, nitride layers, metal layers and the like, which are sequentially deposited on the semiconductor wafer to form the integrated circuits.

A typical CMP apparatus includes a polishing table used for supporting and rotating a CMP pad positioned on the table. A wafer confronting the pad is fixed and rotated by a carrier positioned above the table, which carrier moves vertically to selectively contact the wafer and the CMP pad at a designated pressure. The CMP pad is also rotated at the same time by the polishing table. A slurry mixture, which comprises a mixture of predetermined types of chemicals and other ingredients, is usually provided at the central point of the CMP pad, and is then evenly distributed and coated on the upper surface of the CMP pad by the rotating force of the CMP pad. The semiconductor wafer attached to the wafer carrier selectively contacts the slurry covered CMP pad to carry out the CMP process.

As a result of the relative rotation between the wafer and the CMP pad, and the slurry mixture on the surface of the CMP pad, both mechanical friction and chemical reactions take place, and the material comprising the layer to be polished is gradually removed from the surface of the wafer. More specifically, the mechanical removing action is performed by polishing particles within the polishing slurry and surface bosses of the pad, and a chemical removing action is performed by a chemical ingredient within the polishing slurry. As a result, a wafer is said to be planarized to a certain pre-set thickness on the surface of the wafer.

It is well known that the ultimate quality of the polished state of a wafer depends on several factors, including, among others: (i) the mechanical friction between the CMP pad and the wafer, (ii) the material and state of the CMP pad, (iii) the evenness or uniformity of the surface of the CMP pad, and (iv) the distribution rate and composition of the chemical slurry. This disclosure is mainly directed to the composition of the chemical slurry.

In one particular patterning example, self-aligned contact holes are formed within an inter-silicon oxide layer interposed between a bit line and a semiconductor substrate, or between a storage electrode and a semiconductor substrate, in order to form a plug for connecting the bit line or the storage electrode to an active region of the semiconductor substrate. After filling up the contact holes with a polysilicon layer, a partial CMP process is performed until the surface of the inter-silicon oxide layer is exposed. However, in this example, a problem exists in that the thickness of the inter-silicon oxide layer is not uniform after the partial CMP, which in turn causes additional problems after a full CMP is performed.

FIGS. 1 through 3 illustrate a full conventional CMP process. Referring to FIG. 1, a plurality of gate electrode structures (G1, G2, G3, G4, G5, G6, and G7) are formed on a semiconductor substrate 10. The respective gate electrode structures are comprised of a gate dielectric layer 12, a polysilicon layer 14, a metal silicide layer 16, and a capping layer 18, which are sequentially formed, and a spacer 20 formed on the side walls thereof. An inter-dielectric layer 22 is formed on the entire surface of the semiconductor substrate 10 having the gate electrode structures. The capping layer 18 and the spacer 20 are formed of a material having a greater etching selectivity relative to the inter-dielectric layer 22. The inter-dielectric layer 22 is generally formed of a silicon oxide, and the capping layer 18 and the spacer 20 are formed of a silicon nitride.

After forming a mask 24 on a predetermined portion of the inter-dielectric layer 22, the inter-dielectric layer 22 is etched (using dry etching for example), and contact holes 19 are formed between the gate electrode structures G2 and G3, between the gate electrode structures G3 and G4, and between the gate electrode structures G4 and G5.

During the process for forming the contact holes 19, portions of the capping layer 18 are damaged (i.e., overetched), such as damaged portions 18a of the capping layer of the gate electrode structures G2, G3, G4, G5. The damage results in the capping layer 18a being thinner at the gate electrode structures G2, G3, G4, G5, as compared the thickness of the capping layer 18 of the gate electrode structures G1, G6, G7 under the mask 24.

In FIG. 2, after removing the mask 24, a polysilicon layer 26 is formed on the entire surface of the inter-dielectric layer 22 including the contact holes.

Next, a CMP is performed on the polysilicon layer 26. Since the capping layer 18 of the gate electrode structures G1, G6, G7 is thicker than the capping layer 18a of the gate electrode structures G2, G3, G4, G5 disposed in a region where a plug will be formed, the CMP process stops when it reaches the upper surface of the capping layer 18. Therefore, as shown in FIG. 3, the plug 26a not only fills up the contact holes, but it also has a sufficient layer thickness to "connect" each of the contact holes, even after the CMP process is completed. In other words, the contact holes are not "separated", which can cause shorts unless corrected.

The polishing slurry composition used (see Table 1) has a large removal rate to the silicon oxide layer and the silicon nitride layer, so that if the additional CMP process is performed to separate the plug 26a using this typical polishing slurry, the capping layers 18, 18a of the upper portion of the gate electrode structures become completely removed, and the gate electrodes become damaged.

TABLE 1

Conventional Polishing Slurry Selectivity Rates

| PE-TEOS (Å/minute) | $Si_3N_4$ (Å/minute) | Polysilicon (Å/minute) | Selectivity (PE-TEOS: $Si_3N_4$) | Selectivity (PE-TEOS: polysilicon) |
|---|---|---|---|---|
| 2501 | 588 | 6034 | 4.25 | 0.41 |

Table 1 shows the selectivity when a polysilicon layer, a silicon oxide layer (PE-TEOS), and a silicon nitride layer ($Si_3N_4$), are simultaneously polished, in accordance with the following process conditions. The polishing slurry includes the well known ss-25 base polishing slurry and a fumed silica manufactured by the Cabot Co., which is diluted with deionized water at a ratio of 1:1. The downward force of a polishing head of a polisher manufactured by the Presi Co. is set at 5 psi, and the speed of the polishing table is set at 65 rpm.

As shown in Table 1, since the removal rates of the silicon oxide layer and the silicon nitride layer, which are removed together during the removal of the polysilicon layer, are large, the probability is high that the gate electrodes will be damaged, and it is thus difficult to secure a CMP process margin of the polysilicon layer.

Therefore, to counter this overetching tendency, the capping layer 18 of the gate electrode structures are formed rather thick, which takes into consideration the additional CMP process margin needed to separate the polysilicon plug 26a as described above in FIG. 3. However, this increases the cost and time to produce a device.

Therefore, a need exists for a polishing slurry which exhibits a high removal rate for the polysilicon layer, while exhibiting a much lower removal rate for the silicon oxide layer and the silicon nitride layer.

SUMMARY OF THE INVENTION

To solve the above problems, it is an objective of the present invention to provide a polishing slurry that reduces the removal rates of a silicon oxide layer and a silicon nitride layer, which are exposed and etched together during a CMP of the entire polysilicon layer for forming a polysilicon plug.

It is another objective of the present invention to provide a polishing slurry, in which the removal rate of a silicon oxide layer exposed and etched during an additional CMP process of a polysilicon layer for preventing a short of a polysilicon plug, is higher than the removal rate of a silicon nitride layer, while the layers are being etched simultaneously.

Accordingly, to achieve these and other objectives, there is provided a polishing slurry including an abrasive, deionized water, a pH controlling agent, and polyethylene imine (PEI), having a molecular structure of $[-CH_2CH_3N(CH_2CH_2NH_2)-]_x[-CH_2CH_2NH_2-]_y$, where x and y are positive integers, and where x or y could be zero as well. Using this polishing slurry, the removal rates of the silicon oxide layer and the silicon nitride layer, simultaneously exposed during CMP of a conductive layer such as a polysilicon layer, can be controlled, that is, reduced relative to the removal rate of the polysilicon layer.

Preferably the polyethylene imine content is greater than 0.2 wt % on the basis of the entire polishing slurry. If a polishing slurry including 0.2 wt % PEI is used, and the removal rate of polysilicon is higher than 6000 Å/min, the removal rate of the silicon oxide layer is lower than about 200 Å/min, and the removal rate of a silicon nitride layer is lower than about 350 Å/min. Other discrete removal rates can be achieved by controlling the amount of PEI.

If a choline derivative is further included in the polishing slurry including polyethylene imine, there is a synergetic effect for reducing the removal rates of the oxide layer and the nitride layer. If the choline derivative is included, even if the amount of polyethylene imine is less than 0.2 wt %, the effect of reducing removal rates of the oxide layer and the nitride layer is significant. The choline derivative can be one selected from the group consisting of choline chloride, choline base, choline bromide, choline iodide, choline dihydrogen citrate, choline bitartrate, choline bicarbonate, choline citrate, choline ascobate, choline borate, choline theophyllinate, choline gluconate, acethylcholine chloride, acetylcholine bromide, and methacholine chloride.

In particular, if a polishing slurry including polyethylene imine of about 0.5 wt %, and the choline chloride of about 1.3 wt %, is used, removal rates of a silicon oxide layer and a silicon nitride layer are maintained at a low state during CMP of a polysilicon layer, but the removal rate of the silicon oxide layer is slightly greater than the removal rate of the silicon nitride layer, so that the slurry including the polyethylene imine and the choline derivative can be effectively utilized for forming a plug and separating a node using a CMP process along the entire surface.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE PREFERRED EMBODIMENTS

Figure 1:
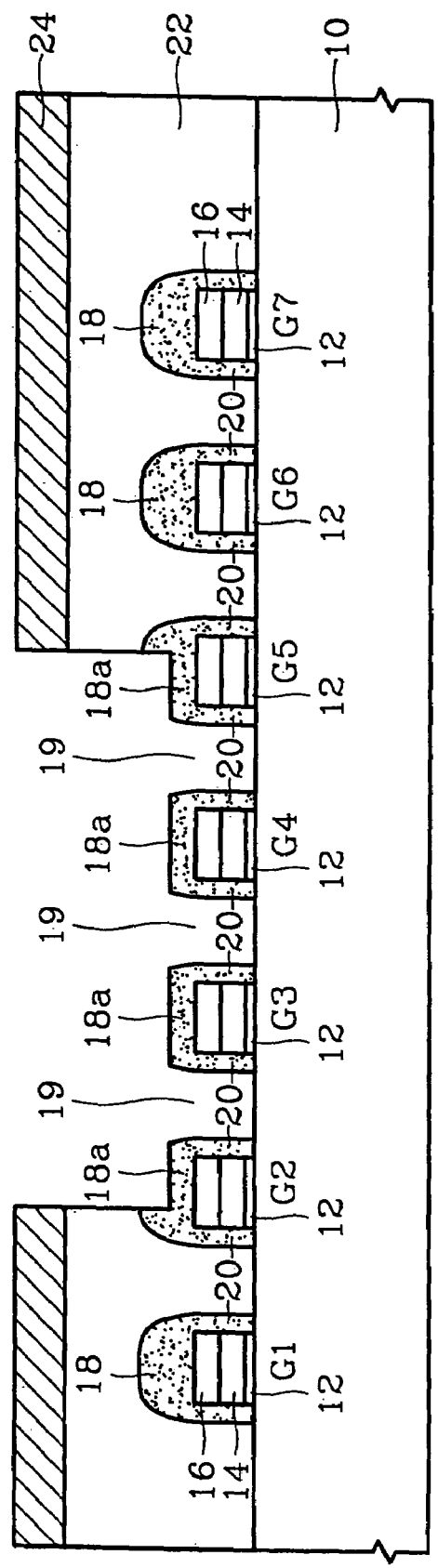
FIGS. 1 through 3 illustrate the steps of forming a conventional self-aligned contact plug using a CMP process along the entire surface.

The present invention will now be described more fully with reference to the accompanying drawings, in which a preferred embodiment of the invention is shown. This invention may, however, be embodied in many different forms and should not be construed as being limited to the embodiments set forth herein. Rather, the embodiments are provided so that this disclosure will be thorough and complete, and will fully convey the concept of the invention to those skilled in the art. In the drawings, the thickness of a layer or region are exaggerated for clarity. It will also be understood that when a layer is referred to as being "on" another layer or substrate, it can be directly on the other layer or substrate, or intervening layers may also be present.

According to the present invention, the polishing slurry broadly includes an abrasive, deionized water, a pH controlling agent (pH=11), and a surfactant.

The abrasive serves to mechanically polish the surface of a semiconductor substrate under pressure from a polisher. The abrasive is selected based on a number of factors, including the particle strength, particle diameter, and chemical properties, as well as the polishing rate and polishing pressure. The abrasive may be a single material or a mixture of several materials. Suitable abrasives are metal oxides such as silica, alumina, titania, zirconia, germania or ceria.

The pH controlling agent controls the pH of the polishing slurry to optimize the dispersion state of the abrasives.

A surfactant, or surface active agent, is a substance that when dissolved in water or an aqueous solution, reduces its surface tension or the interfacial tension between it and another liquid. Different types of surfactants can be used, depending on the desired effect. For example, a dispersing agent may be used for preventing gelation and precipitation of particles due to the aging of the polishing slurry, and for maintaining dispersion stability. Also, a polishing accelerator may be used when it is desired to add a chemical polishing effect to the mechanical polishing process of an abrasive, and thereby enhance the polishing speed and polishing efficiency. A buffer solution may be used for preventing the influence of particles on the dispersion state relative to changes in the pH.

The polishing slurry further includes an additive which can reduce the removal rates of a silicon nitride layer and a silicon oxide layer. Preferably the additive is polyethylene imine (PEI). The PEI has a molecular structure of [—$CH_2CH_3N(CH_2CH_2NH_2)$—]$_x$[—$CH_2CH_2NH$—]$_y$, where x and y are positive integers, and where x or y could be zero as well. The PEI is added to the polishing slurry in a range of about 0.1 wt % to about 10 wt %. Accordingly, the polishing slurry would consist of mixing an abrasive, deionized water, a pH controlling agent, a surfactant, and PEI.

The above mentioned PEI has a molecular structure which can be dissociated, and easily ionized in a solution. That is, the $NH_2$ of the $CH_2CH_2NH_2$, a functional group of [—$CH_2CH_3N(CH_2CH_2NH_2)$—]$_x$, receives a hydrogen in a solution state, and becomes $NH_3^+$, and the NH of the [—$CH_2CH_2NH$—]$_y$ becomes $NH_2^+$. In addition, $SiO_2$, which is a basic structure of a silicon oxide layer, and $Si_3N_4$, which is a basic structure of a silicon nitride layer, take on a negative electric charge of $O^-$, and $NH^-$ or $NH_2^-$ in an alkaline solution having pH 11. Accordingly, $NH_3^+$ and $NH^{2+}$ are combined with the silicon oxide layer and the silicon nitride layer in an anion state by an electrostatic attractive force, and thus forms a passivation layer. The passivation layer formed by the electrostatic attractive force reduces the removal rates of the silicon oxide layer and the silicon nitride layer.

If the conventional polishing slurry without PEI is diluted and used, the removal rates of the silicon oxide layer and the silicon nitride layer cannot be lowered to the desired level. By contrast, if deionized water is added to the polishing slurry of the present invention including PEI, and the diluted polishing slurry is used, the removal rates of the silicon nitride layer and the silicon oxide layer can be lowered, while maintaining a state in which the removal rate of the polysilicon layer is high. This decreases the cost and time to manufacture a semiconductor device.

When PEI is added to the polishing slurry including an abrasive, deionized water, a pH controlling agent, and a surfactant, the removal of a silicon oxide layer and a silicon nitride layer is minimized during a simultaneous CMP process on the polysilicon layer, silicon oxide layer, and silicon nitride layer, while the polysilicon layer can be sufficiently removed, such that the present invention can increase the margin of the CMP process of a polysilicon plug.

In another embodiment of the polishing slurry for reducing the removal rates of the silicon oxide layer and the silicon nitride layer, a choline derivative (described further later) can be further added to the abrasive, pH controlling agent, deionized water, and PEI of the polishing slurry.

Note that even if the silicon oxide layer and the silicon nitride layer are removed using a polishing slurry not including PEI, but including a choline derivative, the removal rate of the silicon nitride layer to the silicon oxide layer is still reduced, and etching selectivity of the silicon oxide layer to the silicon nitride layer is considerably increased. This is because a cation of the choline derivative dissociated in the solution state more readily combines with a nitride ingredient (from the silicon nitride layer) than an oxide ingredient (from the silicon oxide layer).

However, when the choline derivative, having an effect of reducing the removal rate of the silicon nitride layer, is added to the general polishing slurry with the PEI, there is exhibited a synergetic effect of reducing the removal rates of the silicon oxide layer and the silicon nitride layer.

The choline derivative can be one selected from the group consisting of choline chloride, choline base, choline bromide, choline iodide, choline dihydrogen citrate, choline bitartrate, choline bicarbonate, choline citrate, choline ascobate, choline borate, choline theophyllinate, choline gluconate, acethylcholine chloride, acetylcholine bromide, and methacholine chloride.

Among the above-mentioned choline derivatives, it is preferable to use the choline chloride, in an amount ranging between about 0.1 wt % through about 10 wt % of the polishing slurry, with the polishing slurry comprising an abrasive, a pH controlling agent, a surfactant, deionized water, PEI, and the choline chloride.

Figure 2:
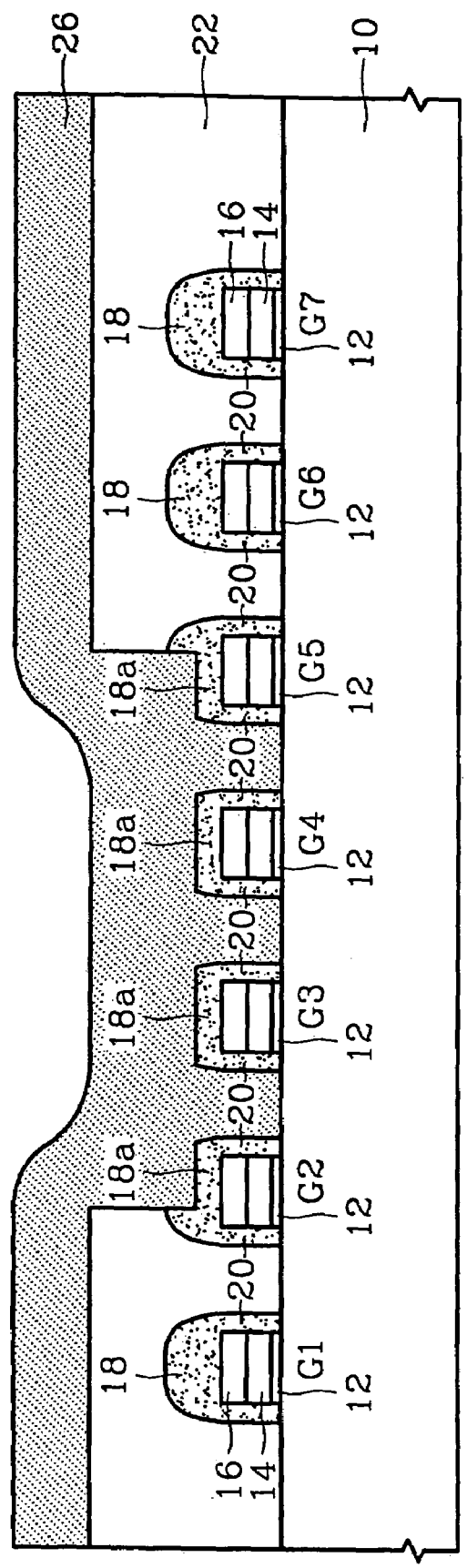
Figure 3:
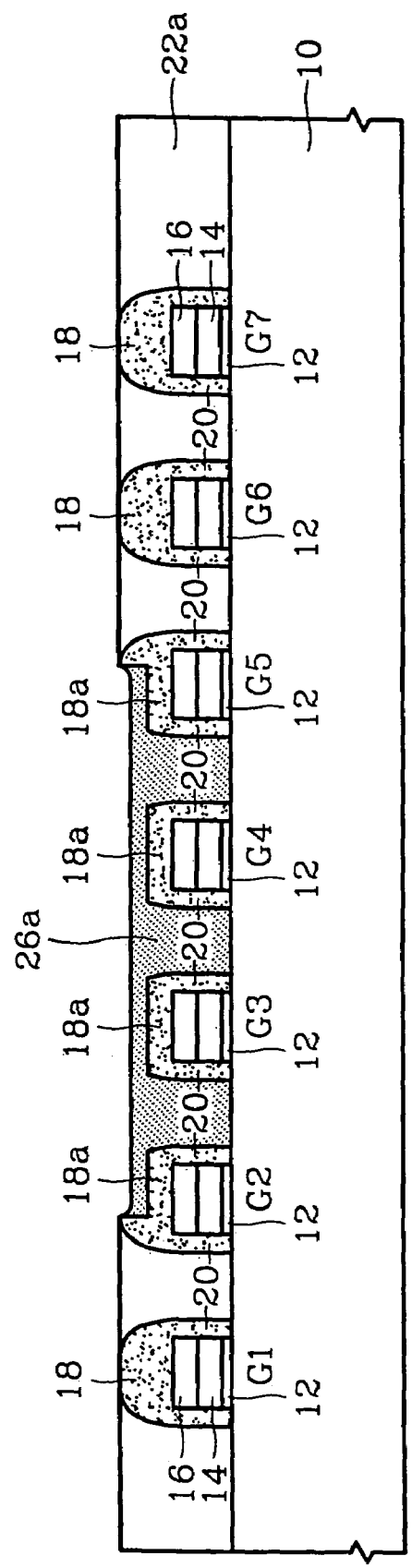

As described previously, FIGS. 1 through 3 illustrate a process of forming a polysilicon plug as a result of performing a CMP process along an entire surface of a substrate. As described above, during the process for forming the contact holes 19, portions of the silicon nitride capping layer 18 are damaged (i.e., overetched), such as damaged portions 18a of the capping layer of the gate electrode structures G2, G3, G4, G5. After removing the mask 24, a polysilicon layer 26 is formed on the entire surface of the inter-dielectric layer 22, and filling the contact holes 19. Next, a CMP is performed on the polysilicon layer 26 and the silicon oxide inter-dielectric layer 22, and continues until it reaches the upper surface of the silicon nitride capping layer 18. Note that the capping layer 18 of the gate electrode structures G1, G6, G7 is thicker than the capping layer 18a of the gate electrode structures G2, G3, G4, G5 disposed in a region where a plug 26a will be formed. As a result, the etched silicon oxide layer 22a, which fills up the area between the gate electrode structures and covers the gate electrode structures, is formed to a level slightly higher than a silicon nitride layer 18a of the top surface of the gate electrode structures G2, G3, G4, G5. Therefore, it is necessary to remove a portion of the polysilicon layer 26 while also removing a portion of the exposed silicon oxide layer 22a and the silicon nitride layer 18a.

This requirement can be satisfied by using the polishing slurry of the present invention, comprising PEI, and a choline derivative, for example, choline chloride. That is, if the polysilicon layer 26, the silicon oxide layer 22a, and the silicon nitride layer 18a are simultaneously etched with the polishing slurry including PEI and a choline derivative, an advantageous result is achieved. Namely, the removal rate of the polysilicon layer 26 stays relatively high, while the removal rates of the silicon oxide layer 22a and the silicon nitride layer 18a become lower, and further, the removal rate of the silicon oxide layer 22a is slightly greater than the removal rate of the silicon nitride layer 18a. Therefore, the margin of the entire surface CMP process can be increased in order to form a self-aligned contact plug, in which the polysilicon 26, silicon oxide layer 22a, and silicon nitride layer 18a are simultaneously exposed and removed.

EXAMPLE 1

In this example, the polishing slurry included the well known SS-25 base polishing slurry manufactured by the Cabot Co., which was diluted with deionized water at a ratio of 1:1. The downward force of a polishing head of a polisher manufactured by the Presi Co. was set at 5 psi, and the speed of the polishing table was set at 65 rpm. Then, the removal rate of $Si_3N_4$ and PE-TEOS with respect to changes in the amount of PEI was investigated. The results are shown in Table 2. Here, PE-TEOS is formed by PE-CVD, and $Si_3N_4$ is formed by LPCVD. The SS-25 includes an abrasive of fumed silica of 35 wt %, a pH controlling agent (pH=11) and deionized water as the main ingredients.

TABLE 2

Removal Rate of $Si_3N_4$ and PE-TEOS as a Function of PEI Amount

| PEI amount (wt %) | PE-TEOS removal rate (Å/min) | $Si_3N_4$ removal rate (Å/min) |
|---|---|---|
| 0.0 wt % | 2778 | 647 |
| 0.2 wt % | 2918 | 611 |
| 0.5 wt % | 152 | 334 |
| 1.25 wt % | 69 | 72 |

The wt % amount of PEI is relative to a mixture including the SS-25 slurry and PEI. As shown in Table 2, the removal rates of $Si_3N_4$ and PE-TEOS with a PEI amount of 0.2 wt % do not show a great difference with the removal rates of $Si_3N_4$ and PE-TEOS when PEI is not added. In fact, the removal rate of PE-TEOS increases. However, if a polishing slurry including PEI of 0.5 wt % is used, the removal rates of $Si_3N_4$ and PE-TEOS, respectively, decrease substantially relative to the case where PEI is not added. That is, if PEI having a concentration of more than 0.02 wt % is added to the polishing slurry, the removal rates of PE-TEOS and $Si_3N_4$ can be abruptly lowered. In addition, as shown in Table 2, discrete rates of removal of the silicon oxide and silicon nitride layers can be achieved by altering the amount of PEI added to the polishing slurry. Accordingly, in addition to a process for forming a plug node as set forth in FIGS. 1 through 3, the present invention can be applied to various CMP processes having different discrete conditions.

EXAMPLE 2

In this example, Table 3 investigates the situation where the removal rates of PE-TEOS and $Si_3N_4$ are determined with respect to a dilution amount of deionized water, where PEI is not added to the base slurry SS-25. Table 4 investigates the situation where the removal rates of PE-TEOS and $Si_3N_4$ are determined with respect to a dilution amount of deionized water, where PEI is added to the base slurry SS-25. As in Example 1, the Table 3 and 4 values were produced on an apparatus in which the downward force of the Presi polishing head was set at 5 psi, and the speed of the polishing table was set at 65 rpm.

The results of Table 3 were obtained using a first dilution ratio (polishing slurry SS-25: deionized water) of 1:1, a second dilution ratio of 1:3, and a third dilution ratio of 1:7. In these examples, the polishing slurry in the first case includes an abrasive in the amount of 12.5 wt %, in the second case it includes an abrasive in the amount of 6.25 wt %, and in the third case it includes an abrasive in the amount of 3.13 wt %.

TABLE 3

Removal Rate of $Si_3N_4$ and PE-TEOS as a Function of Dilution Ratio (no PEI Added)

| Dilution ratio (polishing slurry SS-25:deionized water) | PE-TEOS (Å/min) | $Si_3N_4$ (Å/min) |
|---|---|---|
| 1:1 | 2778 | 647 |
| 1:3 | 1862 | 452 |
| 1:7 | 1281 | 294 |

As shown in Table 3, as the dilution amount was increased, that is, as more deionized water was added to the slurry, the removed rates of PE-TEOS and $Si_3N_4$ decreased accordingly. However, the change in removal rates was not as significant as exhibited in the Table 2 data.

The effect on the PE-TEOS and $Si_3N_4$ removal rates of adding PEI while continuing to dilute the slurry was thus investigated with reference to Table 4. The results of Table 4 were obtained using a first dilution ratio (polishing slurry SS-25: deionized water) of 1:1, a second dilution ratio of 1:3, and a third dilution ratio of 1:7. In these examples, the polishing slurry in the first case includes an abrasive in the amount of 12.5 wt % and PEI in the amount of 0.5 wt %, in the second case it includes an abrasive in the amount of 6.25 wt % and PEI in the amount of 0.25 wt %, and in the third case it includes an abrasive in the amount of 3.13 wt % and PEI in the amount of 0.125 wt %.

TABLE 4

Removal Rate of $Si_3N_4$ and PE-TEOS as a Function of Dilution Ratio (PEI Added)

| Dilution ratio (polishing slurry SS-25:deionized water) | PE-TEOS (Å/min) | $Si_3N_4$ (Å/min) |
|---|---|---|
| 1:1 (0.5 wt % PEI) | 152 | 334 |
| 1:3 (0.25 wt % PEI) | 19 | 31 |
| 1:7 (0.125 wt % PEI) | 13 | 10 |

When compared to the results of Table 3, the results of Table 4 are startling. When PEI is added to the slurry, the removal rates of PE-TEOS and $Si_3N_4$ change abruptly, that is, they are reduced by a large degree as the dilution is increased.

For example, if the polysilicon layer is formed to a thickness of 6000 Å, and the silicon oxide layer and the silicon nitride layer are simultaneously removed using the 1:1 diluted polishing slurry, the removal rates of PE-TEOS and $Si_3N_4$ are, respectively, 152 Å/min and 334 Å/min, as shown in Table 4. Recall from Table 1 that the removal rate for polysilicon using a conventional polishing slurry (e.g., SS-25) was about 6034 Å/min. Therefore, using the conventional SS-25 polishing slurry, SS-25, the removal rate of PE-TEOS to the polysilicon is 0.41 (=2501/6.034; Table 1), and the removal rate of $Si_3N_4$ to the polysilicon is 0.097 (=588/6034; Table 1).

By contrast, when 0.5 wt % PEI is added to the SS-25 as set forth in the present invention, the removal rates of PE-TEOS and $Si_3N_4$ decrease markedly. The removal rate of PE-TEOS to the polysilicon is 0.025 (=152/6000), and the removal rate of $Si_3N_4$ to the polysilicon is 0.056 (=334/6000). As a result, and in accordance with the present invention, when a polysilicon (conductive) layer for a plug, a capping layer and a spacer which are silicon nitride layers, and an inter-dielectric layer which is a silicon oxide layer, are simultaneously etched, the deterioration of the properties of a transistor including a poly gate electrode do not occur, and the desired plug node can be formed.

EXAMPLE 3

In this example, Table 5 investigates the situation of the removal rates of PE-TEOS and $Si_3N_4$ where PEI is added to the base slurry SS-25, and further including a choline derivative. As in Example 1 the Table 5 values were produced on an apparatus in which the downward force of the Presi polishing head was set at 5 psi, and the speed of the polishing table was set at 65 rpm.

TABLE 5

Removal Rate of $Si_3N_4$ and PE-TEOS as a Function of PEI and Choline Derivative Added

| | Polishing slurry type | | | | | |
|---|---|---|---|---|---|---|
| | SS-25 + 0.5 wt % PEI | | SS-25 + 1.3 wt % choline chloride | | SS-25 + 0.5 wt % PEI + 1.3 wt % choline chloride | |
| Layer type | PE-TEOS | $Si_3N_4$ | PE-TEOS | $Si_3N_4$ | PE-TEOS | $Si_3N_4$ |
| Removal rate (Å/min) | 152 | 334 | 2055 | 257 | 19 | 14 |

First, by comparing Table 1 and Table 5, note that if a choline derivative (e.g., choline chloride) is added to general polishing slurry, for example SS-25, the removal rate of PE-TEOS (a silicon oxide layer), does not change very much from 2501 to 2055 Å/min. However, the removal rate of $Si_3N_4$ (a silicon nitride layer), is greatly lowered from 588 to 257 Å/min, and the selectivity of the silicon oxide layer to the silicon nitride layer increases from 4.25 to 7.99.

If only PEI is added to the SS-25 polishing slurry, the removal rates of the silicon oxide layer (from 2501 to 152 Å/min) and the silicon nitride layer (from 588 to 344 Å/min) decrease, but the selectivity of the silicon oxide layer to the silicon nitride layer decreases from 4.25 to 0.44.

If both PEI and choline derivative are added to SS-25 polishing slurry, the removal rates of the silicon oxide layer (from 152 to 19 Å/min) and the silicon nitride layer (from 344 to 14 Å/min) are considerably lowered compared with the case where only PEI is added. That is, compared with the case where only PEI is added, in the case where a choline derivative, more particularly, choline chloride is added, a synergetic effect occurs in the removal rates of the silicon oxide layer and the silicon nitride layer. Therefore, if the choline derivative is added, and even if a smaller amount of PEI is added (less than 0.02 wt %) than the case where only PEI is added to abruptly decrease the removal rates of the silicon oxide layer and the silicon nitride layer (greater than 0.02 wt %), it is readily apparent that the removal rates of the silicon oxide layer and the silicon nitride layer decrease considerably.

One can ensure that the removal rate of the silicon oxide layer is higher than the removal rate of the silicon nitride layer by controlling the amount of choline derivative (in the present example, 1.3 wt %) added to SS-25 with 0.5 wt % PEI. As a result, the polishing slurry including PEI and a choline derivative according to the present invention can be applied to form a desired plug node without deterioration of the properties of a transistor, including a poly gate electrode, during a process in which a polysilicon layer for a plug, a capping layer and a spacer which are silicon nitride layers, and an inter-dielectric layer which is a silicon oxide layer, are simultaneously etched. Moreover, since the removal rate of the silicon oxide layer is higher than the removal rate of the silicon nitride layer, the slurry mixture including the PEI and the choline derivative also lowers the thickness of the inter-dielectric silicon oxide layer 22a (FIG. 3) disposed on each side of the plug node 26a.

While the present invention was described in detail referring to the above embodiments, various modifications, alternate constructions and equivalents may be employed without departing from the true spirit and scope of the present invention.

For example, while the embodiments of the invention described above use PE-TEOS as a silicon oxide layer, it is apparent to one of ordinary skill in the art that the present invention can be applied to any silicon oxide layer having a basic structure of $SiO_2$, for example, a borophosposilicate glass (BPSG), a phosphoresilicate glass (PSG), a borosilicate glass (BSG), a high density plasma (HDP) silicon oxide layer, an undoped silicate glass (USG), a high thermal (HT)-USG, or a plasma enhanced (PE)-silicon oxide layer.

Also, the embodiments of the invention described above can be used with PE-TEOS (silicon oxide layer) and $Si_3N_4$ (silicon nitride layer) formed by PE-CVD, LPCVD, or other plasma chemical vapor deposition or atmospheric vapor deposition methods, and having basic structures of $SiO_2$ and $Si_3N_4$, respectively.

Also, while the embodiments of the invention described above use PEI and/or a choline derivative that are added to polishing slurry using fumed silica as an abrasive, it is apparent to one of ordinary skill in the art that the present invention can be applied to the use of any suitable abrasive (added to PEI and the choline derivative), including for example, colloidal silica, wet silica (stober), sol-gel silica, alumina, titania, zirconia, germania, and ceria.

Moreover, while the embodiments of the invention described above use a polysilicon layer as a conductive material, it is apparent to one of ordinary skill in the art that the present invention can be applied when other conductive materials, for example, tungsten, aluminum, or copper, are simultaneously removed along with an oxide layer and a nitride layer.

In summary, in a CMP process that is simultaneously performed on a polysilicon layer, a silicon oxide layer, and a silicon nitride layer, and using the polishing slurry having PEI and/or a choline derivative or a dilute solution thereof in accordance with the present invention, the removal rate of the polysilicon layer is maintained to be quite large, and the removal rates of the silicon oxide layer and the silicon nitride layer which are removed together can be greatly reduced. Further, if a polishing slurry including PEI and a choline derivative is used, the removal rates of the silicon oxide layer and the silicon nitride layer are lowered, and the removal rate of the silicon oxide layer can be made to be slightly greater than that of the silicon nitride layer during the above mentioned CMP process.

What is claimed is:

1. A chemical mechanical polishing method, comprising simultaneously removing by polishing a conductive layer, a silicon oxide layer and a silicon nitride layer using a polishing slurry comprising an abrasive, deionized water, a pH controlling agent, a choline derivative, and polyethylene imine having a molecular structure of [—$CH_2CH_3N(CH_2CH_2NH_2)$—]$_x$[—$CH_2CH_2NH_2$—]$_y$, where one of x and y is a positive integer, and the other of x and y is 0 or a positive integer, and wherein the choline derivative is choline chloride.

2. The method of claim 1, wherein the silicon oxide layer is one selected from the group consisting of a borophosphorosilicate glass (BPSG), a phosphosilicate glass (PSG), a borosilicate glass (BSG), a high density plasma (HDP) silicon oxide layer, an undoped silicate glass (USG), a high thermal (HT)-USG, and a plasma enhanced (PE)-silicon oxide layer.

3. The method of claim 1, wherein the silicon nitride layer is a dielectric material having a basic formula of $Si_3N_4$.

4. The method of claim 1, wherein the polyethylene imine comprises more than 0.02 wt % of the polishing slurry.

5. The method of claim 1, where both of x and y are positive integers.

* * * * *